United States Patent
Jeromerajan et al.

(10) Patent No.: US 8,563,337 B2
(45) Date of Patent: Oct. 22, 2013

(54) SIMULTANEOUS SILICONE DISPENSION ON COUPLER

(75) Inventors: Premkumar Jeromerajan, Singapore (SG); Gopinath Maasi, Singapore (SG); Tay Thiam Siew Gary, Singapore (SG)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 136 days.

(21) Appl. No.: 13/280,116

(22) Filed: Oct. 24, 2011

(65) Prior Publication Data

US 2013/0102096 A1    Apr. 25, 2013

(51) Int. Cl.
 *H01L 21/00* (2006.01)
(52) U.S. Cl.
 USPC .. 438/22; 438/48; 257/E21.527; 257/E21.617
(58) Field of Classification Search
 USPC ........................ 438/22, 24, 25, 26, 27, 48, 57; 257/E21.527, E21.617, E21.053
 See application file for complete search history.

(56) References Cited

U.S. PATENT DOCUMENTS

| 8,106,406 | B2* | 1/2012 | Liu et al. ........................ 257/81 |
| 2005/0286840 | A1* | 12/2005 | Ho et al. ........................ 385/92 |
| 2008/0191235 | A1 | 8/2008 | Wang et al. |
| 2010/0230791 | A1 | 9/2010 | Tran et al. |
| 2011/0044052 | A1 | 2/2011 | Yoon et al. |
| 2011/0180829 | A1 | 7/2011 | Cho |

OTHER PUBLICATIONS

Morita, Akira, "Dispensing for LEDs: Tighter control through jetting", available at http://www.emasiamag.com/article-7753-dispensingforledstightercontrolthroughjetting-Asia.html, EM Asia Electronics Manufacturing, Ten Alps Communications Asia, Nov. 1, 2010, 3 pages.

* cited by examiner

*Primary Examiner* — Hoai V Pham

(57) ABSTRACT

A semiconductor device and methods of manufacturing the same are disclosed. Specifically, methods and devices for manufacturing optocouplers are disclosed. Even more specifically, methods and devices that deposit one or more encapsulant materials on optocouplers are disclosed. The encapsulant material may include silicone and the devices used to deposit the silicone may be configured to simultaneously deposit the silicone on different sides of the optocoupler, thereby reducing manufacturing steps and time.

10 Claims, 7 Drawing Sheets

SIMULTANEOUS SILICONE DISPENSION ON COUPLER

FIELD OF THE DISCLOSURE

The present disclosure is generally directed toward optocouplers and methods for manufacturing the same.

BACKGROUND

In electronics, an optocoupler, also called an opto-isolator, photocoupler, or optical isolator, is an electronic device designed to transfer electrical signals by utilizing light waves to provide coupling with electrical isolation between its input and output. The main purpose of an optocoupler is to prevent high voltages or rapidly changing voltages on one side of the circuit from damaging components or distorting transmissions on the other side. Commercially available optocouplers can withstand input-to-output voltages up to 10 kV and voltage transients with speeds up to 10 kV/µs.

An optocoupler contains a source (emitter) of light, usually a near infrared light-emitting diode (LED), that converts electrical input signal into light, a closed optical channel (also called dielectrical channel), and a photosensor, which detects incoming light and either generates electric energy directly, or modulates electric current flowing from an external power supply. The photosensor can be a photoresistor, a photodiode, a phototransistor, a silicon-controlled rectifier (SCR) or a triac. Because LEDs can sense light in addition to emitting it, construction of symmetrical, bi-directional optocouplers are possible. An optocoupled solid state relay contains a photodiode optocoupler which drives a power switch, usually a complementary pair of MOSFET transistors. A slotted optical switch contains a source of light and a sensor, but its optical channel is open, allowing modulation of light by external objects obstructing the path of light or reflecting light into the sensor.

Most optocouplers are protected by a silicone encapsulant that is deposited around both the light source and photosensor. Optocouplers are typically manufactured by depositing an amount of silicone on one side of the optocoupler, flipping the optocoupler over, and then depositing another amount of silicone on the other side of the optocoupler. It can be appreciated that this multi-step process is both time-consuming and expensive.

It would be desirable to improve the process of manufacturing optocouplers and minimize the above-noted inefficiencies in current optocoupler manufacturing techniques.

BRIEF DESCRIPTION OF THE DRAWINGS

The present disclosure is described in conjunction with the appended figures.

DETAILED DESCRIPTION

The ensuing description provides embodiments only, and is not intended to limit the scope, applicability, or configuration of the claims. Rather, the ensuing description will provide those skilled in the art with an enabling description for implementing the described embodiments. It being understood that various changes may be made in the function and arrangement of elements without departing from the spirit and scope of the appended claims.

Figure 1:
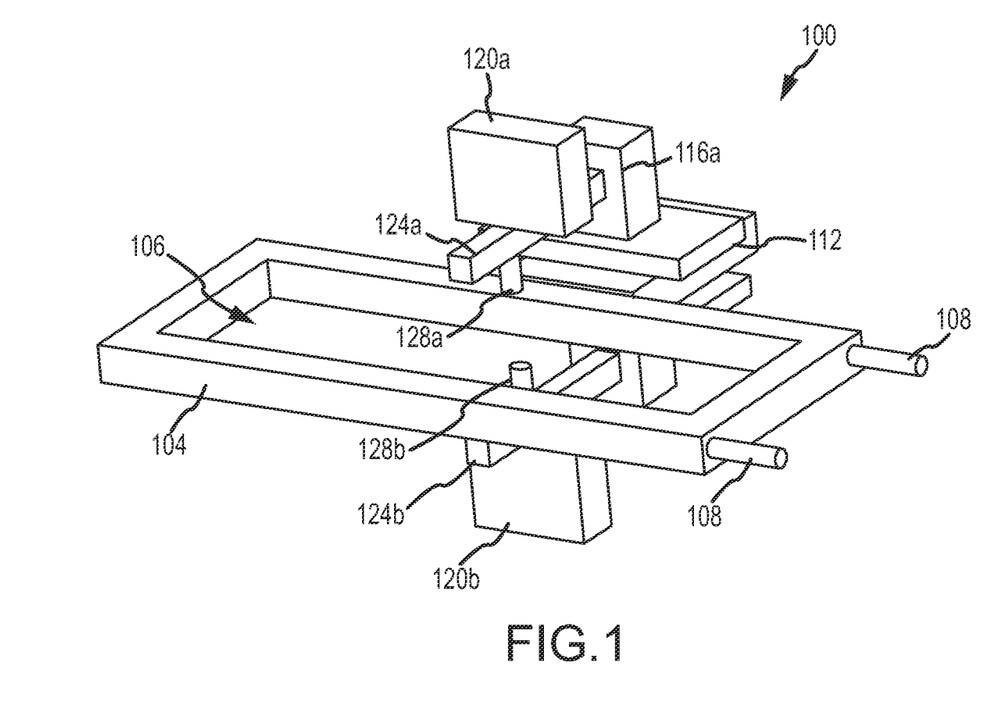
FIG. 1 is an isometric view of a first dispensing device in accordance with embodiments of the present disclosure.
Figure 2:
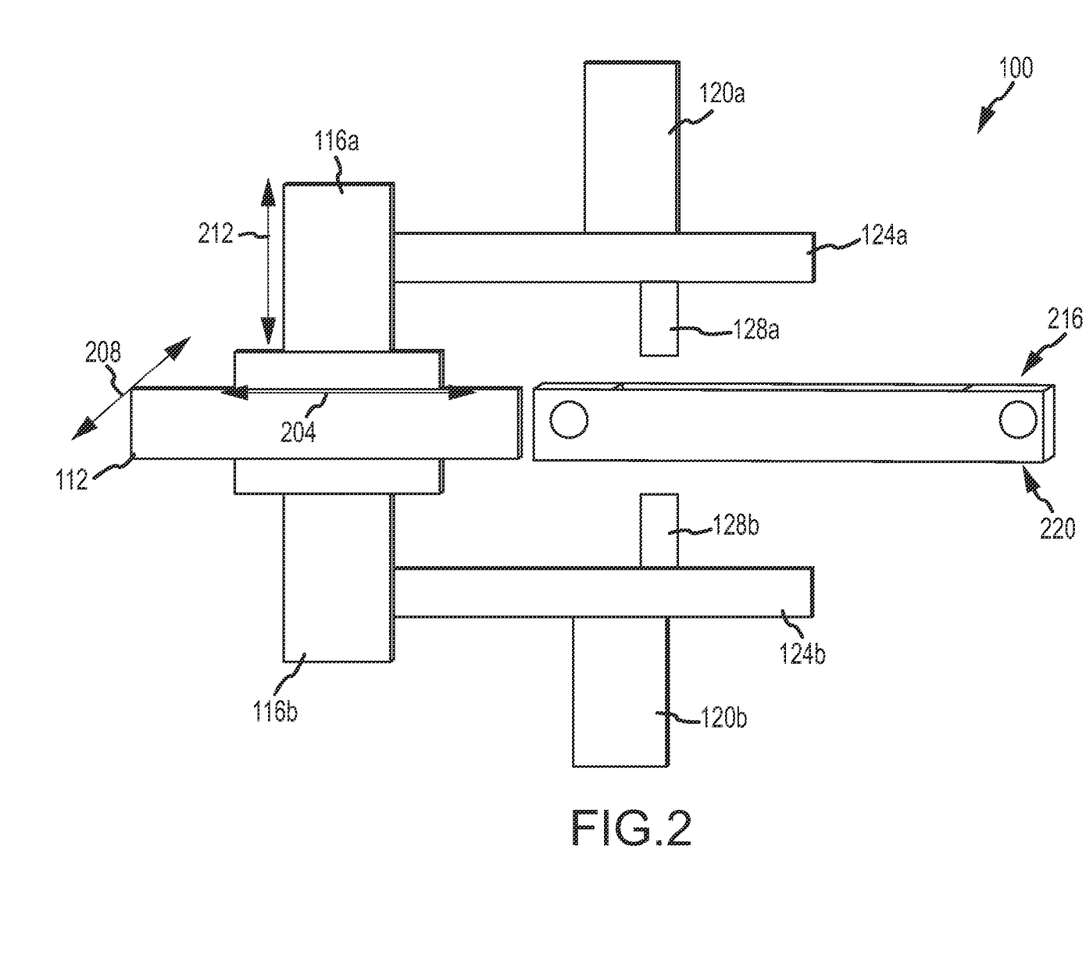
FIG. 2 is a side view of the first dispensing device in accordance with embodiments of the present disclosure.

Referring initially to FIGS. 1 and 2, a first dispensing device 100 will be described in accordance with at least some embodiments of the present disclosure. The first dispensing device 100 may be used during the manufacture of semiconductor devices, such as optocouplers, and other optical devices that require one or more liquid materials to be dispensed thereon. In particular, the first dispensing device 100 may be configured to dispense an encapsulant material on a semiconductor device comprising a light source (e.g., an LED, an array of LEDs, a laser diode, etc.) and/or a photodetector. In some embodiments, the encapsulant material that is dispensed by the device 100 may include an optically-transparent silicone material that is configured to transmit light as well as physically protect the semiconductor device from physical impacts. Other suitable types of encapsulant materials include, without limitation, epoxy, silicone, a hybrid of silicone and epoxy, phosphor, a hybrid of phosphor and silicone, an amorphous polyamide resin or fluorocarbon, glass, plastic, or combinations thereof.

In some embodiments, the first dispensing device 100 is configured to simultaneously deposit first and second amounts of an encapsulant material on opposing sides of the semiconductor device, thereby enabling the dispensing device 100 to increase output efficiencies. To help the dispensing device 100 achieve the above, the first dispensing device 100 comprises a lead frame holder 104 with a holder opening 106 and one or more heater elements 108, a main actuator 112, a first secondary actuator 116a, a second secondary actuator 116b, a first dispensing pump 120a, a second dispensing pump 120b, a first dispensing arm 124a, a second dispensing arm 124b, a first dispensing nozzle 128a, and a second dispensing nozzle 128b.

The first secondary actuator 116a, first dispensing pump 120a, first dispensing arm 124a, and first dispensing nozzle 128a may be collectively referred to as a first dispensing assembly. Similarly, the second secondary actuator 116b, second dispensing pump 120b, second dispensing arm 124b, and second dispensing nozzle 128b may be collectively referred to as a second dispensing assembly. The first and second dispensing assemblies may be connected to one another via the main actuator 112 which controls the movement of the dispensing assemblies relative to the lead frame holder 104 along a first axis 204 (e.g., an x-axis) and a second axis 208 (e.g., a y-axis). In other words, the first and second dispensing assemblies may be moved in unison along the x-axis 204 and y-axis 208 relative to the lead frame holder 104 so as to ensure that the first dispensing nozzle 128a and second dispensing nozzle 128b always directly oppose one another relative to the lead frame holder 104. In an alternative embodiment, the main actuator 112 may comprise two actuators and the first dispensing assembly may be moved along the x-axis 204 and y-axis 208 independent of the second dispensing assembly.

The lead frame holder 104 comprises the holder opening 106 that enables simultaneous access to opposing sides of a lead frame that is being held within the lead frame holder 104. There may be a lip, ridge, notch, or the like provided on the inner surface of the lead frame holder 104 that faces the holder opening 106. This lip, ridge, notch, etc. may enable the lead frame holder 104 to hold the outer edges of a lead frame. Other securing mechanisms may be used to secure a lead frame to the lead frame holder 104.

The heater elements 108 may be configured to provide thermal energy (e.g., conduct heat) either to or from the lead frame holder 104, as required. In some embodiments, the lead frame holder 104 and/or heater elements 108 may be constructed of a thermal conducting-type of material such as metal, metal alloys, ceramics, or the like.

As can be seen in FIG. 2, the lead frame holder 104 may comprise a first major surface 216 and a second major surface 220. The first dispensing nozzle 128a may be located proximate to the first major surface 216 and may be configured to dispense a first amount of the encapsulant material on a first side of an optocoupler that is being held within the opening 106 of the lead frame holder 104. At the same time, the second dispensing nozzle 128b may be located proximate to the second major surface 220 and may be configured to dispense a second amount of the encapsulant material on a second side of the optocoupler that is being held within the opening 106 of the lead frame holder 104.

As noted above, the main actuator 112 may control the movement of the nozzles 128a, 128b relative to the lead frame holder 104 along two axes 204, 208. The secondary actuators 116a, 116b may be configured to control movement of the nozzles 128a, 128b, respectively, relative to the lead frame holder 104 along a third axis 212 (e.g., a z-axis). In particular, the first secondary actuator 116a may be configured to control the movement of the first dispensing arm 124a along the third axis 212, which in-turn controls the relative distance between the first dispensing nozzle 128a and the first major surface 216 of the lead frame holder 104. Similarly, the second secondary actuator 116b may be configured to control the movement of the second dispensing arm 124b along the third axis 212, which in-turn controls the relative distance between the second dispensing nozzle 128b and the second major surface 220 of the lead frame holder 104.

The movement of the first dispensing nozzle 128a along the third axis 212 may be controlled independent of the movement of the second dispensing nozzle 128a along the third axis 212. Specifically, the secondary actuators 116a and 116b may each comprise a separate actuating mechanism (e.g., motor, gears, control Input/Output (I/O), etc.) that operates independent of the other actuating mechanism. However, the secondary actuators 116a and 116b may be commonly connected to the main actuator 212, which simultaneously controls the position of the first and second assemblies along the first and second axes 204, 208, respectively.

The actuators 112, 116a, and/or 116b described herein may comprise any type of known actuator or actuator assembly. Non-limiting examples of technologies that may be used to implement any of the actuators 112, 116a, 116b include linear actuators, rotary actuators, mechanical actuators, hydraulic actuators, pneumatic actuators, piezoelectric actuators, electro-mechanical actuators, telescopic cylinders, screws (e.g., screw jack, ball screw, roller screw, etc.), wheel and axle, hoist, winch, rack and pinion, chain drive, belt drive, rigid chain, rigid belt, cam actuators, and combinations thereof.

As noted above, each of the dispensing assemblies may also comprise components that enable the dispensing assemblies to dispense fixed amounts of an encapsulant material on an optocoupler held by the lead frame holder 104. Specifically, each dispensing assembly may comprise a dispensing pump 120a, 120b that forces or provides an amount of the encapsulant material to the nozzle 128a, 128b via the dispensing arm 124a, 124b. In some embodiments, the encapsulant material may be maintained in the dispensing pump 120a, 120b or it may be moved from a separate reservoir under the force of the dispensing pump 120a, 120b into a tube or cavity that is contained within or attached to the dispensing arm 124a, 124b. The dispensing pump 120a, 120b may continue to apply a force to the encapsulant material such that it passes though the dispensing arm 124a, 124b to the dispensing nozzle 128a, 128b.

Each dispensing nozzle 128a, 128b may comprise an outlet that allows the dispensing nozzle 128a, 128b to dispense a fixed amount of the encapsulant material as the encapsulant material is forced through the dispensing nozzle 128a, 128b by the dispensing pump 120a, 120b.

It should be appreciated that the dispensing pumps 120a and 120b may utilize the same technologies and, therefore, may apply the encapsulant material in a similar manner. It may also be possible to use different fluid-supply components (e.g., dispensing pumps, dispensing arms, and/or dispensing nozzles) in one dispensing assembly as compared to the other dispensing assembly. Specifically, one dispensing assembly may be configured to dispense the encapsulant material with the assistance of gravitational forces. The other dispensing assembly, however, may be configured to dispense the encapsulant material against gravitation forces. Since the dispensing assemblies may be operating under different environmental conditions (e.g., one is working with gravity and the other is working against gravity), it may be possible to individually configure each dispensing assembly to dispense the encapsulant material in a different manner.

Suitable technologies that may be employed for the fluid-supply components of the dispensing assemblies include, but are not limited to, any type of known fluid pump (e.g., direct lift, displacement, and/or gravity pump). More specifically, one or more of the following fluid pump mechanisms may be used for the dispensing pumps 120a, 120b: rotary positive displacement pumps; reciprocating positive displacement pumps; gear pump; screw pump; progressing cavity pump; roots-type pumps; peristaltic pump; plunger pumps; compressed-air-powered double-diaphragm pumps; rope pumps; impulse pumps; hydraulic ram pumps; velocity pumps; centrifugal pump; radial flow pumps; axial flow pumps; mixed flow pumps; eductor-jet pump; gravity pumps; steam pumps; valveless pumps; and combinations thereof.

Figure 3:
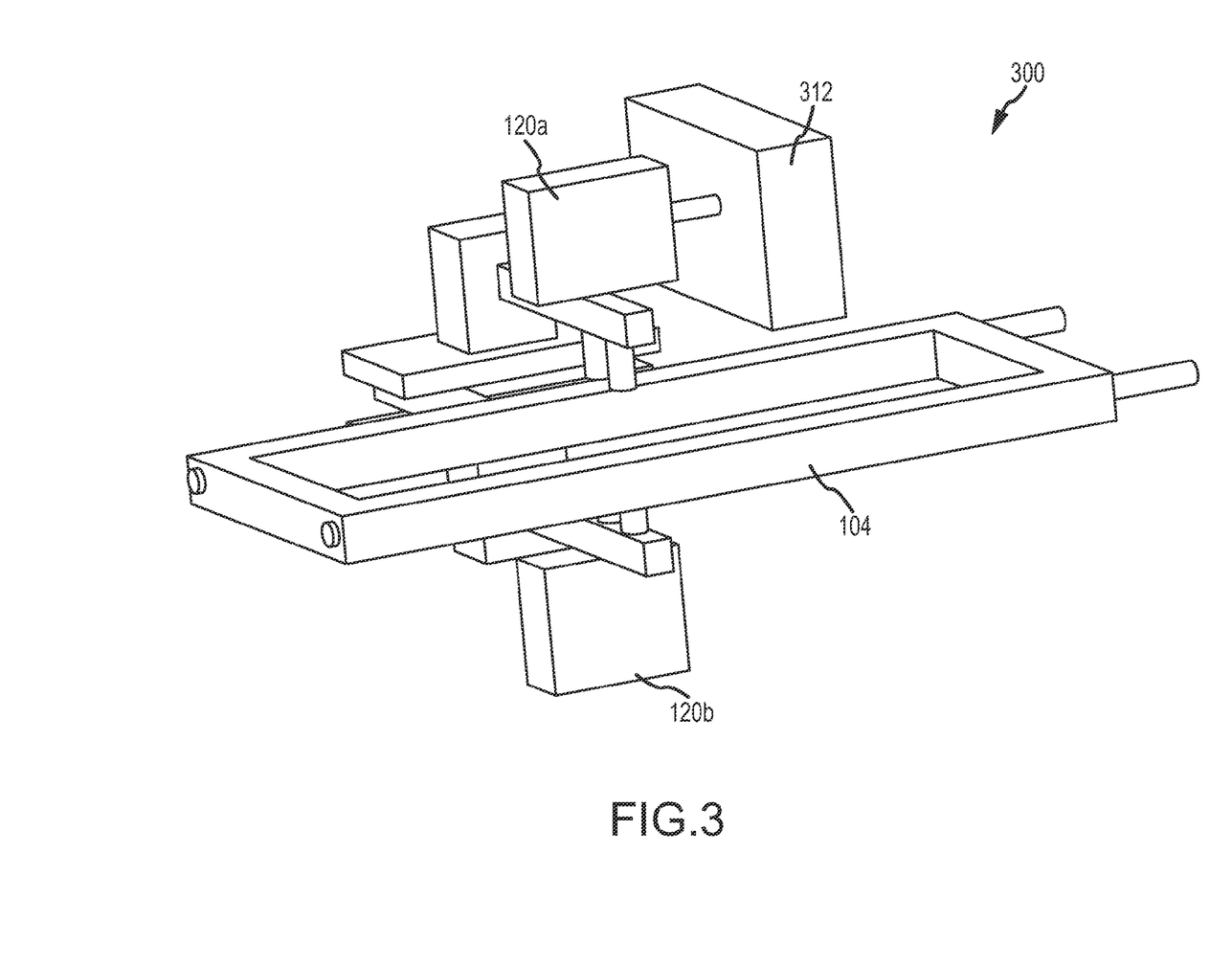
FIG. 3 is an isometric view of the second dispensing device in accordance with embodiments of the present disclosure.
Figure 4:
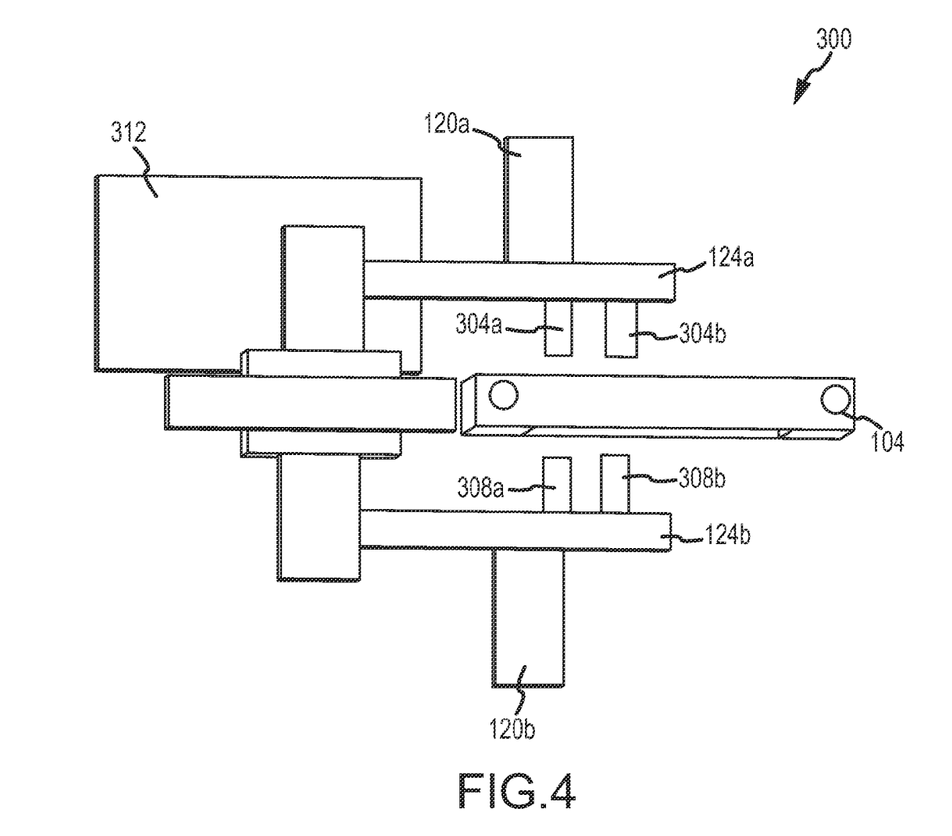
FIG. 4 is a side view of a second dispensing device in accordance with embodiments of the present disclosure.

Referring now to FIGS. 3 and 4, a second dispensing device 300 will be described in accordance with at least some embodiments of the present disclosure. The second dispensing device 300 may be substantially similar to the first dispensing device 100 and unless stated otherwise, it should be understood that the components of the second dispensing device 300 may be similar or identical to the components of the first dispensing device 100. It should also be appreciated that certain aspects of the second dispensing device 300 may be incorporated into the first dispensing device 100 without departing from the scope of the present disclosure.

One difference between the second dispensing device 300 and the first dispensing device 100 is that each dispensing assembly of the second dispensing device 300 comprises multiple dispensing nozzles. Specifically, the first dispensing assembly of the second dispensing device 300 may comprise a first top nozzle 304a and a second top nozzle 304b. Similarly, the second dispensing assembly of the second dispensing device 300 may comprise a first bottom nozzle 308a and a second bottom nozzle 308b. The construction of the nozzles 304a, 304b, 308a, 308b may be similar to the nozzles 128a, 128b. Furthermore, each of the nozzles on a common dispensing arm 124a or 124b may receive the encapsulant material from a common source. Specifically, although two nozzles are depicted on each dispensing arm 124a, 124b, there is only a single dispensing pump 120a, 120b for each dispensing arm 124a, 124b. It should be appreciated that each nozzle may have its own dedicated dispensing pump.

The distance between the top nozzles 304a, 304b along the first dispensing arm 124a may be fixed or adjustable. Likewise, the distance between the bottom nozzles 308a, 308b along the second dispensing arm 124b may be fixed or adjustable. In some embodiments, the distance between the nozzles may be configured to substantially match a distance between optocouplers on a common lead frame. By providing multiple nozzles on each dispensing assembly, the second dispensing device 300 is capable of outputting the encapsulant material at a faster rater and, therefore, providing an increased product output rate.

Although only two top nozzles 304a, 304b and two bottom nozzles 308a, 308b are depicted and described, it should be appreciated that two, three, four, five, or more nozzles may be provided on the first dispensing arm 124a and/or second dispensing arm 124b. It should also be appreciated that the number of nozzles on the first dispensing assembly does not necessarily need to equal the number of nozzles on the second dispensing assembly.

Another difference between the second dispensing device 300 and the first dispensing device 100 is that the second dispensing device 300 is shown to include a controller 312. The controller 312 may comprise functionality that helps automate the dispensing process. Specifically, the controller may comprise one or more position inputs from the actuators to determine (or estimate) the location of the dispensing nozzles relative to the lead frame holder 104. The controller 312 may also comprise software or firmware programming instructions that process the position inputs and provide automated output signals that control the movement of the actuators, thereby automating the movement of the nozzles relative to the lead frame holder 104.

The dispensing device 300 may comprise one controller 312 or multiple controllers (e.g., one for each actuator or one for each dispensing assembly). The controller 312 may also be enclosed in a metal or plastic housing that protects the I/O components and microprocessors of the controller 312 from the encapsulant material and other environmental issues.

Figure 5:
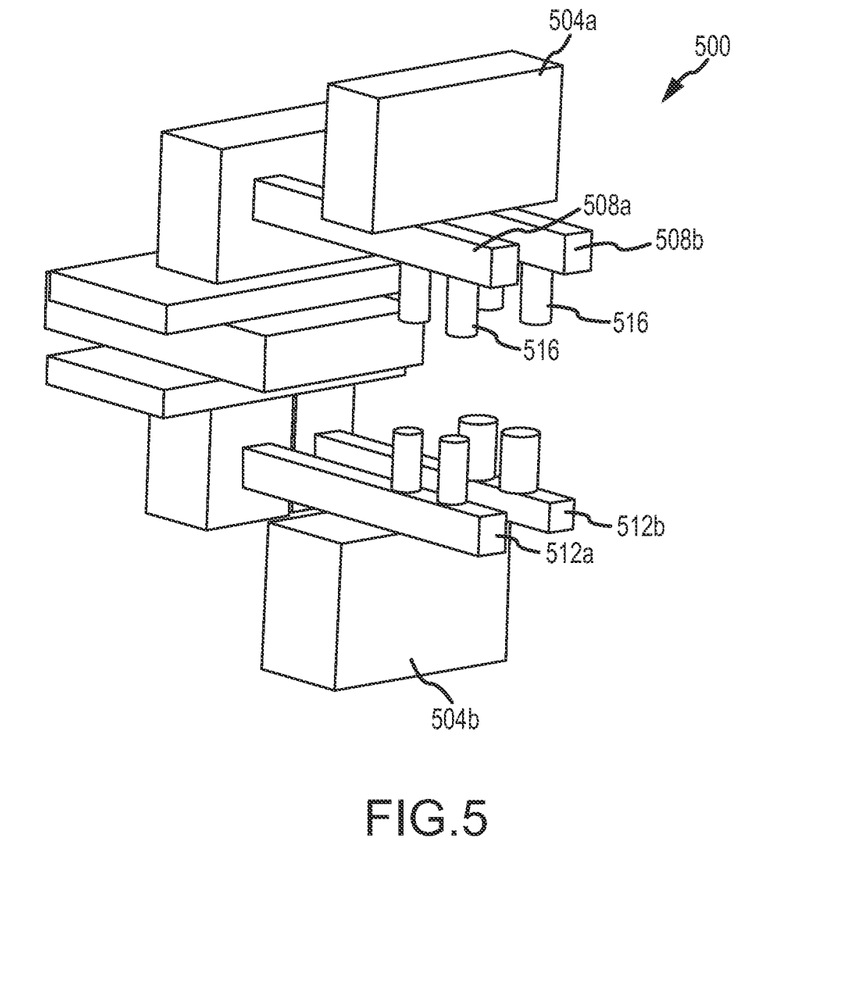
FIG. 5 is an isometric view of a third dispensing device in accordance with embodiments of the present disclosure.

Referring now to FIG. 5, a third dispensing device 500 will be described in accordance with at least some embodiments of the present disclosure. The third dispensing device 500 may be substantially similar to the first dispensing device 100 and/or second dispensing device 300 and, unless stated otherwise, it should be understood that the components of the third dispensing device 500 may be similar or identical to the components of the first dispensing device 100 and/or dispensing device 300. It should also be appreciated that certain aspects of the third dispensing device 500 may be incorporated into the first dispensing device 100 and/or third dispensing device 300, and vice versa, without departing from the scope of the present disclosure.

The primary difference between the third dispensing device 500 and the previously-discussed dispensing devices is that the third dispensing device 500 comprises multiple dispensing arms on each of the dispensing assemblies. Specifically, the first dispensing assembly comprises a first top dispensing arm 508a and a second top dispensing arm 508b. Likewise, the second dispensing assembly comprises a first bottom dispensing arm 512a and a second bottom dispensing arm 512b.

The top dispensing arms 508a, 508b may be connected to a common secondary actuator 116a or they may have their own dedicated secondary actuators. Similarly, the bottom dispensing arms 512a, 512b may be connected to a common secondary actuator 116b or they may have their own dedicated secondary actuators.

The third dispensing device 500 is also depicted as having a first common dispensing pump 504a and a second common dispensing pump 504b. The common dispensing pumps 504a, 504b may be configured to provide the encapsulant material to all of the dispensing arms on the dispensing assembly. Of course, each dispensing arm may have its own dedicated dispensing pump and/or source of encapsulant material.

The embodiment depicted in FIG. 5 also shows each dispensing arm 508a, 508b, 512a, 512b as having a plurality of dispensing nozzles 516. Much like the second dispensing device 300, the third dispensing device 500 may comprise one, two, three, four, five, or more nozzles 516 on a dispensing arm and it is not a requirement that each dispensing arm has the same number of nozzles 516.

With reference now to FIGS. 6A-D, a method of manufacturing an optocoupler will be described in accordance with at least some embodiments of the present disclosure. Although the method is depicted for a single optocoupler, those of skill in the art will appreciate that the method for manufacturing a single optocoupler can be duplicated simultaneously for batch manufacturing. Specifically, a semiconductor device 600 comprising a lead frame 604 can be placed in the lead frame holder 104 that has a plurality of optocouplers and the plurality of optocouplers can be encapsulated as described herein either sequentially or simultaneously, depending upon the type of dispensing device 100, 300, 500 used to encapsulate the optocoupler.

Figure 6A:
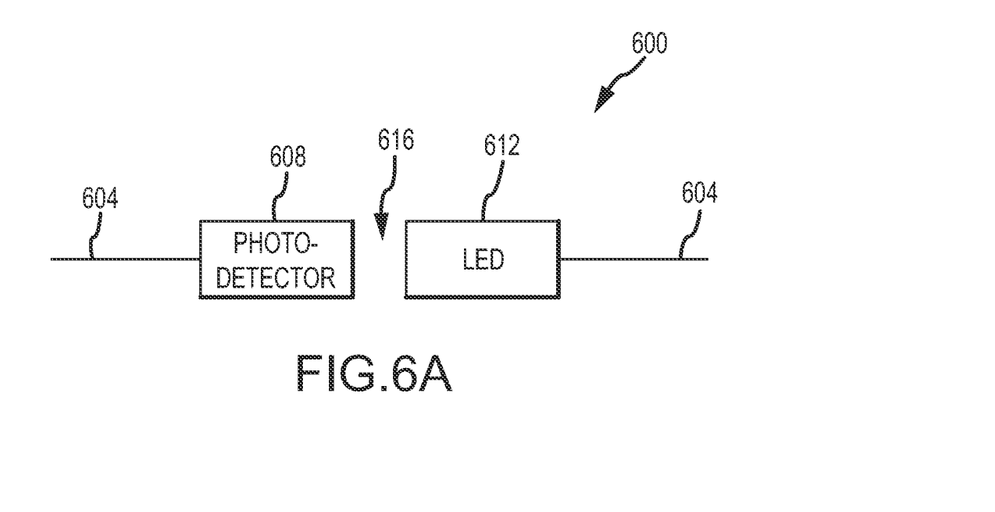
FIG. 6A is side view of an optocoupler in a first manufacturing stage in accordance with embodiments of the present disclosure.

The method begins as depicted in FIG. 6A by obtaining the un-encapsulated components of one or more optocouplers. The lead frame 604 may comprise a single set of optocoupler components, specifically an optocoupler may comprise one or more photodetectors 608 and a light source, such as an LED 612, that are separated from one another by a gap 616. The gap 616 provides an electrical isolation between one side of a circuit that has the LED 612 and another side of a circuit that has the photodetector 608.

The components of the optocoupler may be held by the lead frame 604, which is secured, attached, or otherwise resting on the lead frame holder 104. The lead frame 604 may comprise metal or any other type of electrically-conductive material.

Figure 6B:
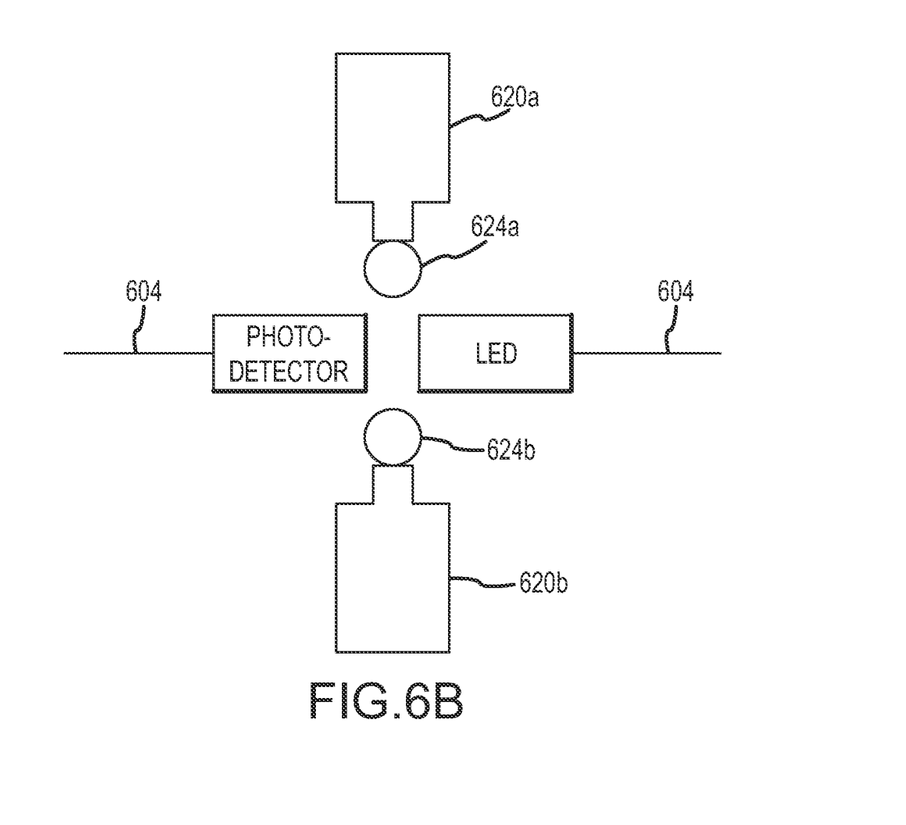
FIG. 6B is side view of an optocoupler in a second manufacturing stage in accordance with embodiments of the present disclosure.

As can be seen in FIG. 6B, a first dispensing assembly 620a is positioned proximate a first side of the optocoupler while a second dispensing assembly 620b is positioned proximate a second side of the optocoupler. More specifically, the first and second dispensing assemblies 620a, 620b may be positioned on opposing sides of the optocoupler (e.g., proximate the first and second major surfaces 216, 220 of the lead frame holder 104).

The dispensing assemblies 620a, 620b may correspond to any type of dispensing assembly from the dispensing devices 100, 300, 500 described herein. Alternatively, or in addition, the dispensing assemblies 620a, 620b may comprise combinations of the dispensing assemblies described herein.

The first dispensing assembly 620a produces a first amount of encapsulant material 624a and the second dispensing assembly 620b produces a second amount of encapsulant material 624b. The encapsulant materials produced by the dispensing assemblies 620a, 620b do not necessarily have to be of the same type. Rather, the first dispensing assembly 620a may dispense a first type of encapsulant material (e.g., silicone) and the second dispensing assembly 620b may dispense a second type of encapsulant material (e.g., silicone with phosphor).

Figure 6C:
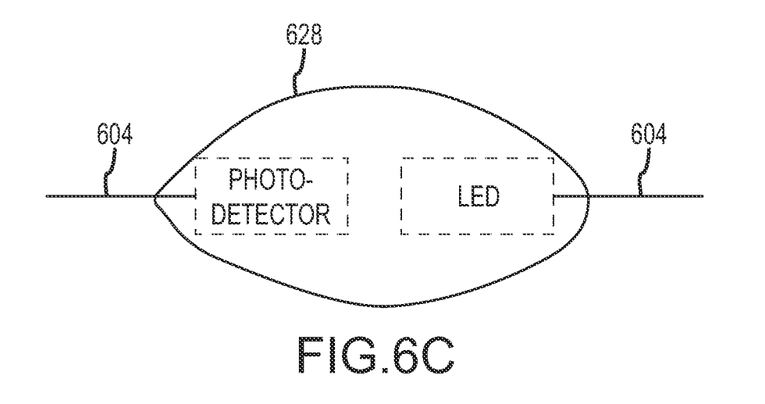
FIG. 6C is side view of an optocoupler in a third manufacturing stage in accordance with embodiments of the present disclosure.

The first and second amounts of the encapsulant material may be simultaneously applied to the optocoupler such that the photodetector 608 and LED 612 are completely encapsulated within an encapsulant 628 (see FIG. 6C). Thereafter, the dispensing assemblies 620a, 620b (or more specifically the nozzles of the dispensing assemblies) may be removed from the optocoupler.

Figure 6D:
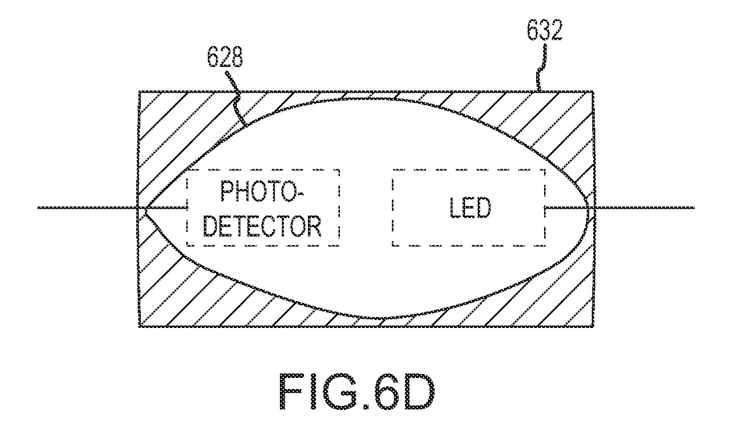
FIG. 6D is side view of an optocoupler in a fourth manufacturing stage in accordance with embodiments of the present disclosure.

FIG. 6D shows the final, but optional, manufacturing step where the encapsulant 628 is enclosed within a molding 632. Specifically, a plastic material may be molded around the encapsulant to provide additional structure for physically protecting the encapsulant 628 and the components of the optocoupler. In some embodiments, the molding 632 may be constructed of any polymer or combination of polymers using extrusion, machining, micro-machining, molding, injection molding, or a combination of such manufacturing techniques. As a non-limiting example, the molding 632 may comprise polyphthalamide (PPA) or similar types of polymers such as epoxy (green, non-green) and other molds, which may be optically opaque, thereby optically isolating the photodetector 608 and LED 612 within the encapsulant 628.

Specific details were given in the description to provide a thorough understanding of the embodiments. However, it will be understood by one of ordinary skill in the art that the embodiments may be practiced without these specific details. In other instances, well-known circuits, processes, algorithms, structures, and techniques may be shown without unnecessary detail in order to avoid obscuring the embodiments.

While illustrative embodiments of the disclosure have been described in detail herein, it is to be understood that the inventive concepts may be otherwise variously embodied and employed, and that the appended claims are intended to be construed to include such variations, except as limited by the prior art.

What is claimed is:

1. A method of manufacturing an optocoupler, comprising:
    positioning a lead frame comprising one or more optocouplers in a lead frame holder of a dispensing system; and
    depositing, at substantially the same time, an encapsulant material on a first and second side of the lead frame such that optical components of the one or more optocouplers are encapsulated in the encapsulant material.

2. The method of claim 1, wherein the optical components of the one or more optocouplers comprise a light source and a photodetector.

3. The method of claim 1, wherein the encapsulant material comprises silicone.

4. The method of claim 1, wherein the first side corresponds to a first major surface of the lead frame and the second side corresponds to a second major surface of the lead frame that opposes the first major surface.

5. The method of claim 1, wherein a dispensing pump is used to deposit the encapsulant material.

6. The method of claim 1, wherein a first dispensing mechanism is used to deposit the encapsulant material on the first side of the lead frame and wherein a second dispensing mechanism is used to deposit the encapsulant material on the second side of the lead frame.

7. The method of claim 6, wherein the first dispensing mechanism is assisted by gravitational forces and wherein the second dispensing mechanism opposes gravitational forces.

8. The method of claim 6, wherein the first dispensing mechanism comprises at least one of a positive displacement pump, a centrifugal pump, and a roto-dynamic pump.

9. A method of manufacturing a plurality of semiconductor devices, comprising:
    holding a lead frame comprising a plurality of light source and photodetector pairs in a first position;
    while the lead frame is in the first position, dispensing a first amount of an encapsulant on a first side of the plurality of light source and photodetector pairs; and
    while the lead frame is in the first position, dispensing a second amount of the encapsulant on a second side of the plurality of light source and photodetector pairs, wherein the dispensing a second amount of the encapsulant is performed substantially simultaneous with the dispensing the first amount of the encapsulant.

10. The method of claim 9, wherein each of the plurality of light source and photodetector pairs comprise an optocoupler and wherein the encapsulant comprises silicone.

* * * * *